United States Patent
Suzuki et al.

(10) Patent No.: US 9,991,345 B2
(45) Date of Patent: Jun. 5, 2018

(54) SEMICONDUCTOR DEVICE

(71) Applicant: TOYODA GOSEI CO., LTD., Kiyosu-shi (JP)

(72) Inventors: Tomoyuki Suzuki, Kiyosu (JP); Junya Nishii, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days. days.

(21) Appl. No.: 15/710,407

(22) Filed: Sep. 20, 2017

(65) Prior Publication Data

US 2018/0097071 A1 Apr. 5, 2018

(30) Foreign Application Priority Data

Sep. 30, 2016 (JP) .................... 2016-192551

(51) Int. Cl.
*H01L 29/20* (2006.01)
*H01L 29/66* (2006.01)
*H01L 21/02* (2006.01)
*H01L 29/51* (2006.01)

(52) U.S. Cl.
CPC .... *H01L 29/2003* (2013.01); *H01L 21/02145* (2013.01); *H01L 21/02356* (2013.01); *H01L 29/517* (2013.01); *H01L 29/66477* (2013.01)

(58) Field of Classification Search
CPC .............. H01L 29/2003; H01L 29/517; H01L 21/02145; H01L 29/66477; H01L 21/02356
See application file for complete search history.

(56) References Cited

U.S. PATENT DOCUMENTS

2012/0205663 A1* 8/2012 Nakamura ............ H01L 23/291
257/76

OTHER PUBLICATIONS

Yujin Hori, "Process Conditions for Improvement of Electrical Properties of $Al_2O_3$/n-GaN Structures Prepared by Atomic Layer Deposition," Japanese Journal of Applied Physics vol. 49 (2010) 080201.

* cited by examiner

*Primary Examiner* — Kyoung Lee
(74) *Attorney, Agent, or Firm* — McGinn IP Law Group, PLLC

(57) ABSTRACT

There is provided a semiconductor device comprising a group III nitride semiconductor layer; a gate insulating film formed on the group III nitride semiconductor layer; and a gate electrode formed on the gate insulating film. The gate insulating film comprises a first film that is placed on the group III nitride semiconductor layer, includes silicon and has a higher crystallization temperature than a crystallization temperature of aluminum oxide; and a second film that is placed on the first film and contains aluminum oxide. The first film has a hydrogen concentration of not lower than $1\times10^{21}$ atoms/cm$^3$, a nitrogen concentration of not lower than $1\times10^{19}$ atoms/cm$^3$ and a carbon concentration of not lower than $1\times10^{19}$ atoms/cm$^3$. This configuration prevents crystallization of aluminum oxide.

6 Claims, 13 Drawing Sheets

Fig.5
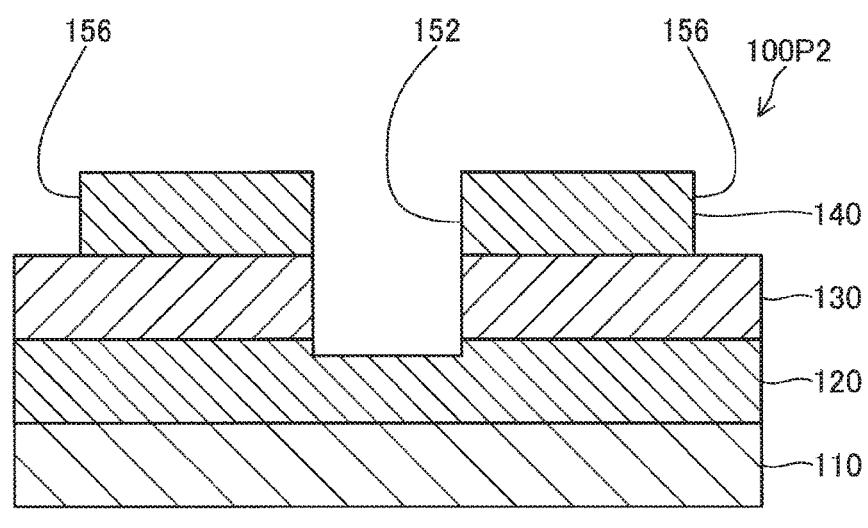
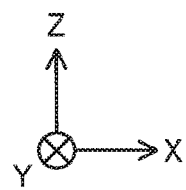

Fig.6
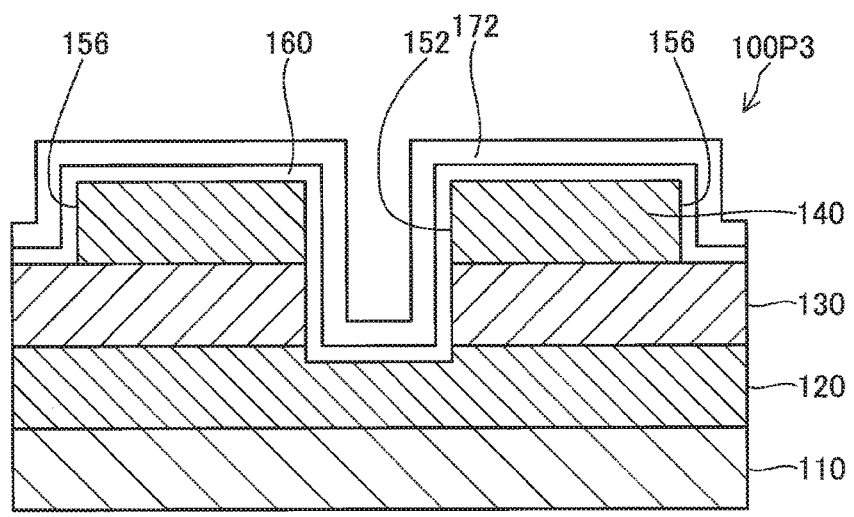
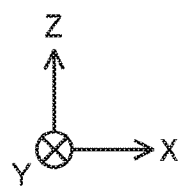

US 9,991,345 B2

SEMICONDUCTOR DEVICE

CROSS-REFERENCE TO RELATED APPLICATION

The present application claims priority from Japanese patent application 2016-192551 filed on Sep. 30, 2016, the entirety of the content of which is hereby incorporated by reference into this application.

BACKGROUND

Technical Field

The disclosure relates to a semiconductor device.

Related Art

A semiconductor device may be configured to include a semiconductor layer, a gate insulating film formed on the semiconductor layer and a gate electrode formed on the gate insulating film. It is known that silicon dioxide ($SiO_2$) is used for the gate insulating film.

According to Yujin Hori, Japanese Journal of Applied Physics Volume 49, Number 8R, aluminum oxide ($Al_2O_3$) having a higher relative permittivity than that of silicon dioxide is used as the gate insulating film on a group III nitride semiconductor layer. This configuration is, however, likely to cause the following problem. After formation of the gate insulating film using aluminum oxide on the group III nitride semiconductor layer, aluminum oxide may be crystallized by heat treatment at an interface between the group III nitride semiconductor layer and aluminum oxide. A crystal grain boundary generated by crystallization serves as a pathway of electron propagation and thereby leads to an increase in leakage current. An interface state formed by crystallization causes a carrier to be trapped and varies a threshold voltage. In order to solve this problem, there is a demand for preventing crystallization of aluminum oxide when aluminum oxide is used for the gate insulating film formed on the group III nitride semiconductor layer.

SUMMARY

According to one aspect of the present disclosure, there is provided a semiconductor device. This semiconductor device comprises a group III nitride semiconductor layer; a gate insulating film formed on the group III nitride semiconductor layer; and a gate electrode formed on the gate insulating film. The gate insulating film comprises a first film that is placed on the group III nitride semiconductor layer, includes silicon and has a higher crystallization temperature than a crystallization temperature of aluminum oxide; and a second film that is placed on the first film and contains aluminum oxide. The first film has a hydrogen concentration of not lower than $1 \times 10^{21}$ atoms/cm$^3$, a nitrogen concentration of not lower than $1 \times 10^{19}$ atoms/cm$^3$ and a carbon concentration of not lower than $1 \times 10^{19}$ atoms/cm$^3$.

BRIEF DESCRIPTION OF DRAWINGS

FIG. 5 is a sectional view schematically illustrating the configuration of a semiconductor device in the course of manufacture;

FIG. 6 is a sectional view schematically illustrating the configuration of a semiconductor device in the course of manufacture;

DETAILED DESCRIPTION

A. First Embodiment

A-1. Configuration of Semiconductor Device

Figure 1:
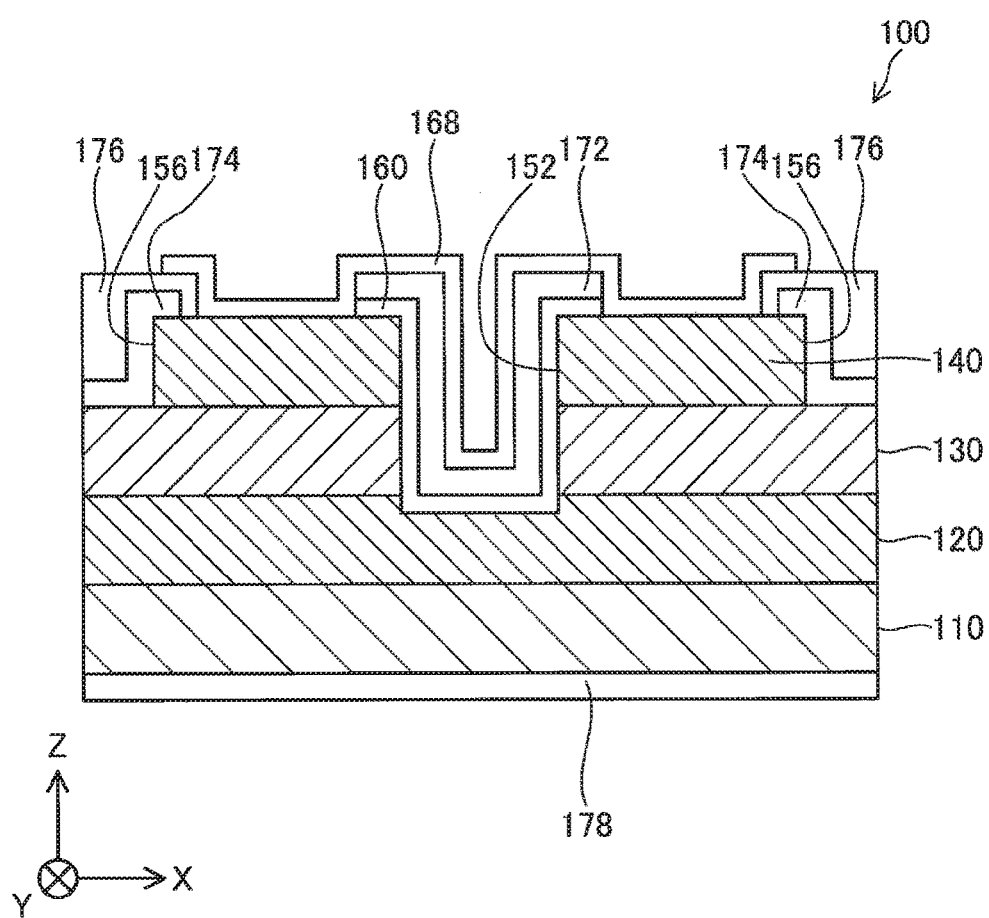
FIG. 1 is a sectional view schematically illustrating the configuration of a semiconductor device.

FIG. 1 is a sectional view schematically illustrating the configuration of a semiconductor device 100. An X axis, a Y axis and a Z axis that are orthogonal to one another are illustrated in FIG. 1. The X axis is an axis extended from left to right in FIG. 1. The Y axis is an axis extended from front to back of the sheet surface in FIG. 1. The Z axis is an axis extended from bottom to top in FIG. 1. XYZ axes in other drawings correspond to the XYZ axes in FIG. 1. In the description hereof, a positive (+) direction of the Z axis may be called "upper" or "upward" for the purpose of convenience. The expression of "upper" or "upward" is, however, not intended to limit the arrangement (direction) of the semiconductor device 100. In other words, the semiconductor device 100 may be arranged in any direction.

The semiconductor device 100 is a group III nitride-based semiconductor device formed by using a group III nitride semiconductor. According to this embodiment, the semiconductor device 100 is a GaN-based semiconductor device formed by using gallium nitride (GaN). According to this embodiment, the semiconductor device 100 is used for power control and is also called power device.

The semiconductor device 100 includes a substrate 110, an n-type semiconductor layer 120, a p-type semiconductor layer 130 and an n-type semiconductor layer 140. The semiconductor device 100 also includes a trench 152 and recesses 156 as structures formed in the respective semiconductor layers. The semiconductor device 100 further includes a gate insulating film 160, a passivation film 168, a gate electrode 172 as a control electrode, p-body electrodes 174, source electrodes 176 and a drain electrode 178.

The substrate 110 is a semiconductor. According to this embodiment, the substrate 110 is mainly made of gallium nitride (GaN). In the description hereof, the expression of "mainly made of gallium nitride (GaN)" means containing gallium nitride (GaN) at 90% or higher molar fraction. According to this embodiment, the substrate 110 contains silicon (Si) as the donor element. According to this embodiment, the substrate 110 is an n-type semiconductor having n-type characteristics.

The n-type semiconductor layer 120 is a semiconductor that is formed in a plate-like shape extended in the X-axis direction and in the Y-axis direction and that has n-type characteristics. The n-type semiconductor layer 120 is located on the substrate 110. According to this embodiment, the n-type semiconductor layer 120 is mainly made of gallium nitride (GaN). According to this embodiment, the n-type semiconductor layer 120 contains silicon (Si) as the donor element.

The p-type semiconductor layer 130 is a semiconductor that is formed in a plate-like shape extended in the X-axis direction and in the Y-axis direction and that has p-type characteristics. The p-type semiconductor layer 130 is located on the n-type semiconductor layer 120. According to this embodiment, the p-type semiconductor layer 130 is mainly made of gallium nitride (GaN). According to this embodiment, the p-type semiconductor layer 130 contains magnesium (Mg) as the acceptor element.

The n-type semiconductor layer 140 is a semiconductor that is formed in a plate-like shape extended in the X-axis direction and in the Y-axis direction and that has n-type characteristics. The n-type semiconductor layer 140 is located on the p-type semiconductor layer 130. According to this embodiment, the n-type semiconductor layer 140 is mainly made of gallium nitride (GaN). According to this embodiment, the n-type semiconductor layer 140 contains silicon (Si) as the donor element.

The trench 152 is a groove that is recessed from the n-type semiconductor layer 140 to pass through the p-type semiconductor layer 130 and to cut part of the n-type semiconductor layer 120. The trench 152 is a structure formed by dry etching in the respective semiconductor layers.

The recess 156 is a groove that is recessed to pass through the n-type semiconductor layer 140 and to cut part of the p-type semiconductor layer 130. The recess 156 is a structure formed by dry etching in the n-type semiconductor layer 140 and part of the p-type semiconductor layer 130.

The gate insulating film 160 is a film having electrical insulating properties. The gate insulating film 160 is provided to cover the trench 152 and the surface of a portion of the n-type semiconductor layer 140 near to the trench 152. According to this embodiment, the gate insulating film 160 is formed to cover a bottom face and a side face of the trench 152 such that the thickness of the gate insulating film 160 formed to cover the bottom face of the trench 152 is equal to the thickness of the gate insulating film 160 formed to cover the side face of the trench 152. The expression of "thickness is equal" means that the difference between the thickness of the gate insulating film 160 formed to cover the bottom face of the trench 152 and the thickness of the gate insulating film 160 formed to cover the side face of the trench 152 is within ±5%. The gate insulating film 160 includes a first film 162 and a second film 164.

Figure 2:
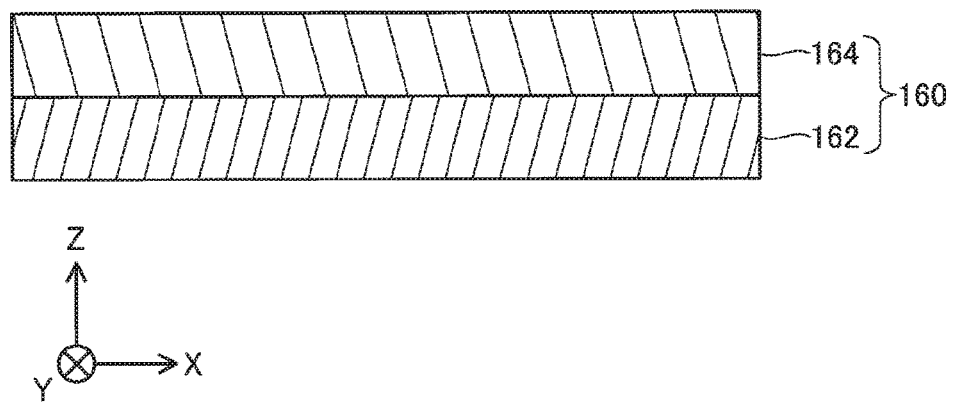
FIG. 2 is a diagram illustrating the structure of a gate insulating film.

FIG. 2 is a diagram illustrating the structure of the gate insulating film 160. The first film 162 is placed on the n-type semiconductor layer 140 and includes silicon and has a higher crystallization temperature than that of aluminum oxide ($Al_2O_3$). According to this embodiment, the first film 162 contains silicon dioxide ($SiO_2$). According to another embodiment, the first film 162 may contain SiOx, SiNx, SiON or SiOC. The first layer 162 has a thickness of 5 nm.

The first film 162 has a hydrogen concentration of preferably not lower than $1 \times 10^{21}$ atoms/cm$^3$ or more preferably not lower than $3 \times 10^{21}$ atoms/cm$^3$. The hydrogen concentration of the first film 162 is also preferably not higher than $5 \times 10^{21}$ atoms/cm$^3$. According to this embodiment, the hydrogen concentration of the first film 162 is $3 \times 10^{21}$ atoms/cm$^3$.

The first film 162 has a nitrogen concentration of preferably not lower than $1 \times 10^{19}$ atoms/cm$^3$ or more preferably not lower than $1 \times 10^{20}$ atoms/cm$^3$. The nitrogen concentration of the first film 162 is also preferably not higher than $2 \times 10^{20}$ atoms/cm$^3$. According to this embodiment, the nitrogen concentration of the first film 162 is $1 \times 10^{20}$ atoms/cm$^3$.

The first film 162 has a carbon concentration of preferably not lower than $1 \times 10^{19}$ atoms/cm$^3$ or more preferably not lower than $2 \times 10^{19}$ atoms/cm$^3$. The carbon concentration of the first film 162 is also preferably not higher than $5 \times 10^{19}$ atoms/cm$^3$. According to this embodiment, the carbon concentration of the first film 162 is $2 \times 10^{19}$ atoms/cm$^3$.

The second film 164 is placed on the first film 162 and contains aluminum oxide ($Al_2O_3$).

According to this embodiment, the first film 162 and the second film 164 are formed by atomic layer deposition. The first film 162 is formed by atomic layer deposition using ozone as an oxidizing agent.

According to this embodiment, the gate insulating film 160 is formed by continuously and successively depositing the second film 164 after deposition of the first film 162. The expression of "continuously and successively" herein means that the semiconductor device in the course of manufacture is not taken out from a chamber in vacuum that is a production space (to be exposed to the ambient air) in the process of formation of the gate insulating film 160.

Referring back to FIG. 1, the passivation film 168 is a film having electrical insulating properties. The passivation film 168 is provided to cover a +Z-axis direction side of the gate electrode 172, a +Z-axis direction side of a center-side portion of the n-type semiconductor layer 140 with respect to the X-axis direction, and a +Z-axis direction side of an n-type semiconductor layer 140-side portion of the source electrode 176 with respect to the X-axis direction. The passivation film 168 is mainly made of silicon nitride (SiN).

The gate electrode 172 is an electrode that is placed at a position in contact with the gate insulating film 160 and is formed inside of the trench 152 via the gate insulating film 160. The gate electrode 172 is formed from inside of the trench 152 to outside of the trench 152. According to this embodiment, the gate electrode 172 is mainly made of titanium nitride (TiN). When a voltage is applied to the gate electrode 172, an inversion layer is formed in the p-type semiconductor layer 130. This inversion layer serves as a channel, so that an electrical conduction pathway is formed between the source electrode 176 and the drain electrode 178.

The p-body electrode 174 is an electrode that is in ohmic contact with the p-type semiconductor layer 130. The p-body electrode 174 is formed inside of the recess 156. The p-body electrode 174 is mainly made of palladium (Pd).

The source electrode 176 is an electrode that is in ohmic contact with the n-type semiconductor layer 140. According to this embodiment, the source electrode 176 is formed from the upper side of the p-body electrode 174 to the upper side of the n-type semiconductor layer 140. According to this embodiment, the source electrode 176 is a multi-layer electrode formed by sequentially stacking a layer mainly made of titanium (Ti), a layer mainly made of aluminum (Al) and a layer mainly made of palladium (Pd) from the n-type semiconductor layer 140-side.

The drain electrode 178 is an electrode that is in ohmic contact with a lower surface of the substrate 110. The drain electrode 178 is a multi-layer electrode formed by sequentially stacking a layer mainly made of titanium (Ti) and a layer mainly made of aluminum (Al) from the substrate 110-side.

A-2. Manufacturing Method of Semiconductor Device

Figure 3:
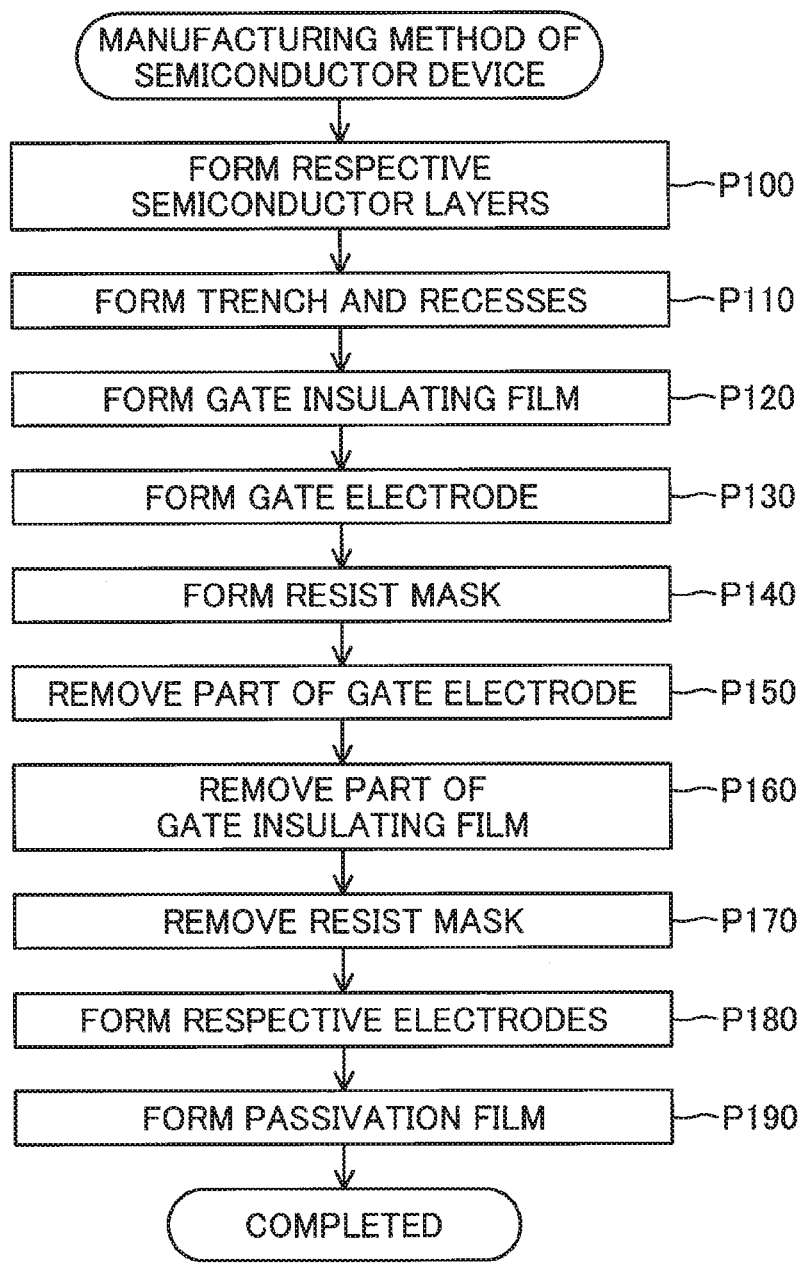
FIG. 3 is a process chart showing a manufacturing method of the semiconductor device according to a first embodiment.

FIG. 3 is a process chart showing a manufacturing method of the semiconductor device 100 according to the first embodiment. The manufacturer first sequentially forms the n-type semiconductor layer 120, the p-type semiconductor layer 130 and the n-type semiconductor layer 140 on the substrate 110 (process P100). According to this embodiment, the manufacturer forms the n-type semiconductor layer 120, the p-type semiconductor layer 130 and the n-type semiconductor layer 140 by metal organic chemical vapor deposition (MOCVD).

Figure 4:
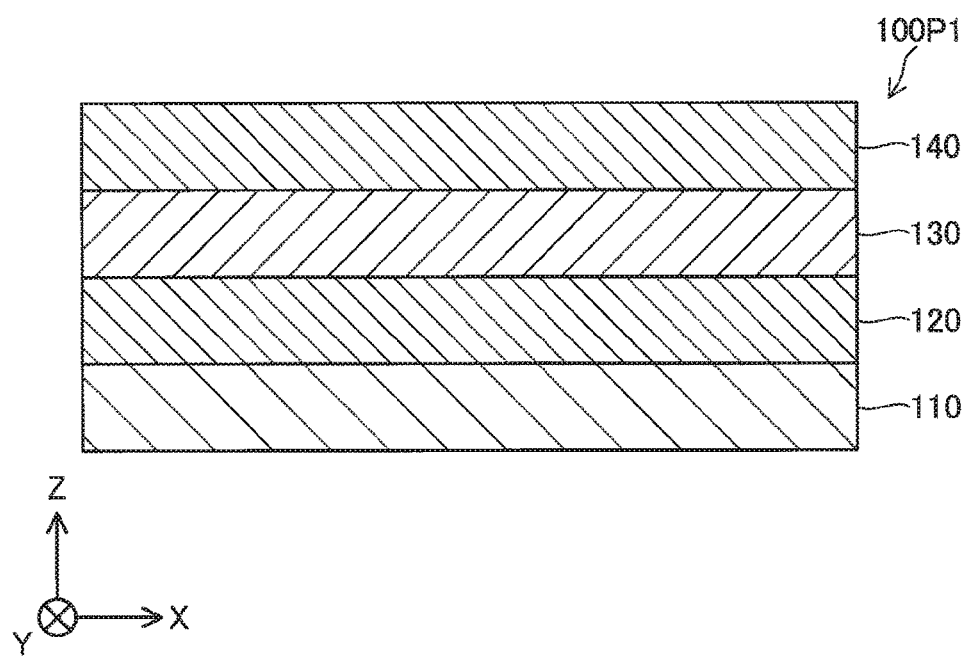
FIG. 4 is a sectional view schematically illustrating the configuration of a semiconductor device in the course of manufacture.

FIG. 4 is a sectional view schematically illustrating the configuration of a semiconductor device 100P1 in the course of manufacture. FIG. 4 illustrates the configuration of the semiconductor device 100P1 after completion of process P100. The n-type semiconductor layer 120, the p-type semiconductor layer 130 and the n-type semiconductor layer 140 are formed on the substrate 110 by process P100.

After forming the n-type semiconductor layer 120, the p-type semiconductor layer 130 and the n-type semiconductor layer 140 (process P100 in FIG. 3), the manufacturer forms the trench 152 and the recesses 156 (process P110). The manufacturer forms the trench 152 and the recesses 156 by dry etching.

FIG. 5 is a sectional view schematically illustrating the configuration of a semiconductor device 100P2 in the course of manufacture. FIG. 5 illustrates the configuration of the semiconductor device 100P2 after completion of process P110. The trench 152 and the recesses 156 are formed in the semiconductor device 100P2 by process P110.

After forming the trench 152 and the recesses 156 (process P110 in FIG. 3), the manufacturer forms the gate insulating film 160 (process P120). The manufacturer continuously and successively forms the first film 162 and the second film 164 by atomic layer deposition, so as to form the gate insulating film 160. According to this embodiment, the first film 162 is formed by atomic layer deposition using ozone as an oxidizing agent. Heat treatment at all process P120 and subsequent processes is performed at temperature of not higher than 550° C. This aims to prevent crystallization in the second film 164.

After forming the gate insulating film 160 (process P120), the manufacturer forms the gate electrode 172 (process P130). The manufacturer forms the gate electrode 172 by sputtering.

FIG. 6 is a sectional view schematically illustrating the configuration of a semiconductor device 100P3 in the course of manufacture. FIG. 6 illustrates the configuration of the semiconductor device 100P3 after completion of process P130. The gate insulating film 160 and the gate electrode 172 are formed in the semiconductor device 100P3 by process P120 and process P130.

After forming the gate electrode 172 (process P130 in FIG. 3), the manufacturer forms a resist mask 200 (process P140). The manufacturer forms the resist mask 200 by photolithography. After forming the resist mask 200 (process P140), the manufacturer removes a portion of the gate electrode 172 having its +Z-axis direction side that is not covered by the resist mask 200 (process P150). The manufacturer removes the portion of the gate electrode 172 having its +Z-axis direction side that is not covered by the resist mask 200 by dry etching.

Figure 7:
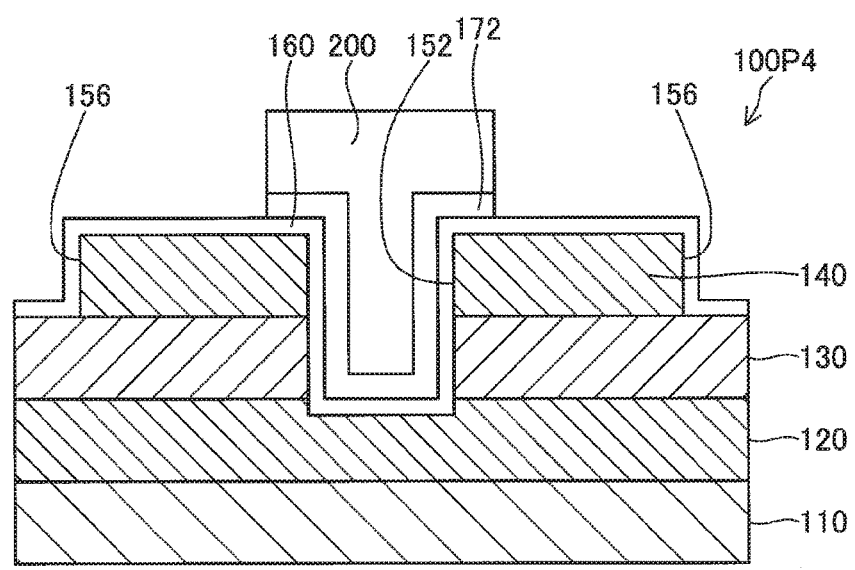
FIG. 7 is a sectional view schematically illustrating the configuration of a semiconductor device in the course of manufacture.

FIG. 7 is a sectional view schematically illustrating the configuration of a semiconductor device 100P4 in the course of manufacture. FIG. 7 illustrates the configuration of the semiconductor device 100P4 after completion of process P150. The gate electrode 172 remains between the resist mask 200 and the trench 152 along with a region of the n-type semiconductor layer 140 near to the trench 152, in the semiconductor device 100P4 by process P150.

After removing the portion of the gate electrode 172 that is not covered by the resist mask 200 (process P150 in FIG. 3), the manufacturer removes a portion of the gate insulating film 160 having its +Z-axis direction side that is not covered by the resist mask 200 (process P160). The manufacturer removes the portion of the gate insulating film 160 having its +Z-axis direction side that is not covered by the resist mask 200 by dry etching.

Figure 8:
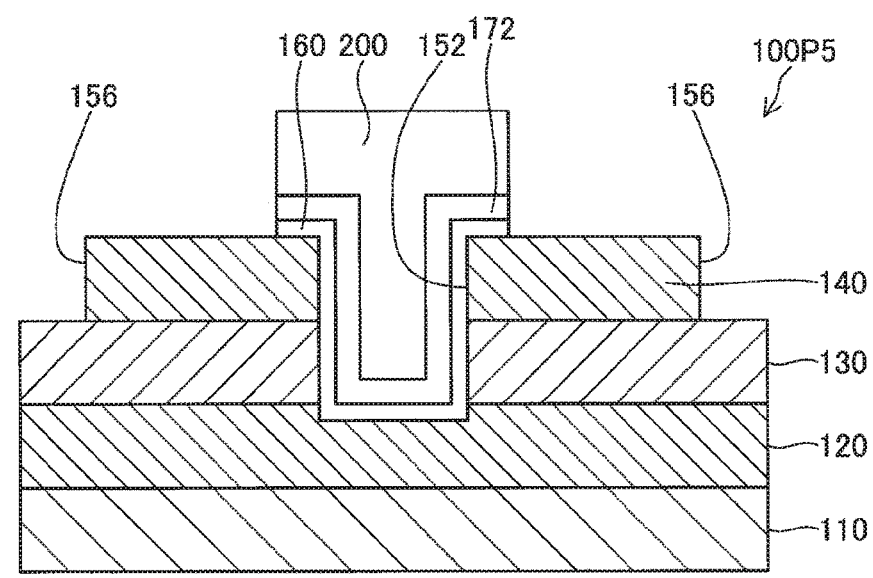
FIG. 8 is a sectional view schematically illustrating the configuration of a semiconductor device in the course of manufacture.

FIG. 8 is a sectional view schematically illustrating the configuration of a semiconductor device 100P5 in the course of manufacture. FIG. 8 illustrates the configuration of the semiconductor device 100P5 after completion of process P160. The gate insulating film 160 remains between the resist mask 200 and the trench 152 along with a region of the n-type semiconductor layer 140 near to the trench 152, in the semiconductor device 100P5 by process P160.

After removing the portion of the gate insulating film 160 that is not covered by the resist mask 200 (process P160 in FIG. 3), the manufacturer removes the resist mask 200 (process P170). The manufacturer removes the resist mask 200 using oxygen plasma. After removing the resist mask 200 (process P170), the manufacturer forms the p-body electrodes 174, the source electrodes 176 and the drain electrode 178 (process P180). The manufacturer sequentially forms the p-body electrodes 174, the source electrodes 176 and the drain electrode 178. The manufacturer forms the p-body electrodes 174, the source electrodes 176 and the drain electrode 178 by lifting-off.

Figure 9:
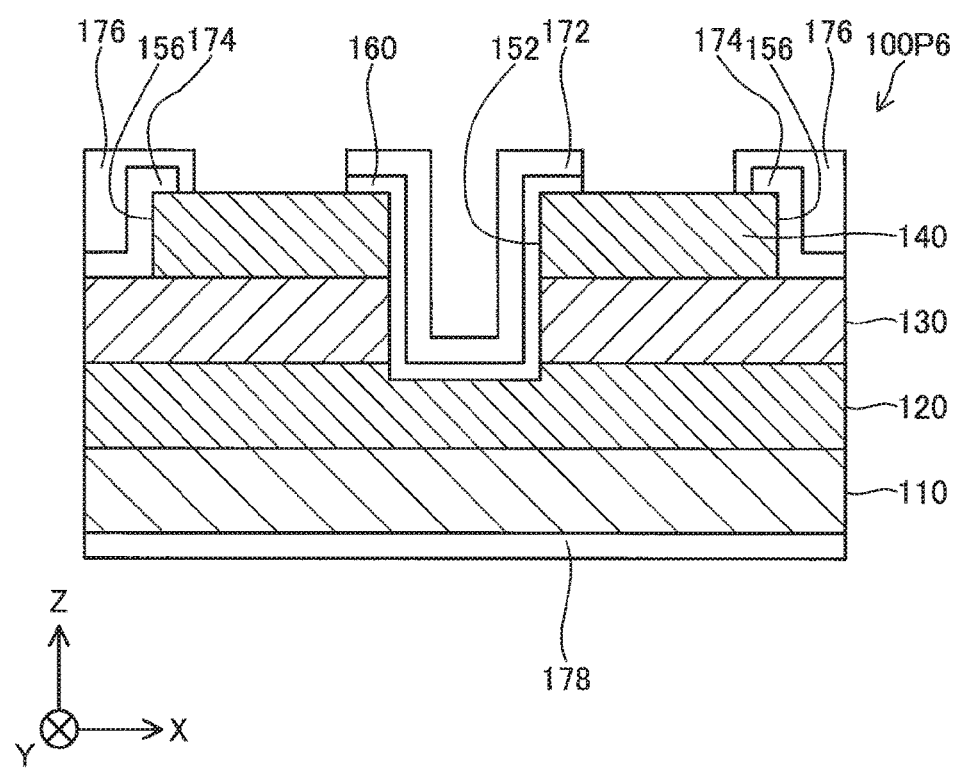
FIG. 9 is a sectional view schematically illustrating the configuration of a semiconductor device in the course of manufacture.

FIG. 9 is a sectional view schematically illustrating the configuration of a semiconductor device 100P6 in the course of manufacture. FIG. 9 illustrates the configuration of the semiconductor device 100P6 after completion of process P180. The p-body electrodes 174, the source electrodes 176 and the drain electrode 178 are formed in the semiconductor device 100P6 by process P180.

After forming the electrodes (process P180 in FIG. 3), the manufacturer forms the passivation film 168 (process P190). The manufacturer forms the passivation film 168 by plasma chemical vapor deposition (plasma CVD). The semiconductor device 100 shown in FIG. 1 is completed through process P100 to process P190.

A-3. First Evaluation Test

In a first evaluation test, the examiner formed a semiconductor epitaxial layer mainly made of gallium nitride on an n-type semiconductor substrate mainly made of gallium nitride by crystal growth and subsequently formed an insulating film on the semiconductor epitaxial layer, so as to produce samples S1 and S2.

The insulating film in the sample S1 is mainly made of aluminum oxide ($Al_2O_3$). The thickness of the insulating film in the sample S1 is 50 nm. The insulating film in the sample S2 is identical with the gate insulating film 160 of the first embodiment. The first film 162 and the second film 164 are sequentially placed on the semiconductor epitaxial layer in the sample S2. The thickness of the first film 162 is 8 nm.

The thickness of the second film 164 is 45 nm. With respect to all the gate insulating films 160 in the sample S2 produced in the first evaluation test, samples S4 and S5 produced in a second evaluation test described later, and samples S4a and S4b produced in a third evaluation test described later, the first film 162 and the second film 164 were formed by atomic layer deposition.

The examiner processed the samples S1 and S2 by heat treatment at 500° C. in a nitrogen atmosphere and subsequently observed the state of crystallization in a cross section of the sample S1 and in a cross section of the sample S2 with a transmission electron microscope (TEM). In observation, the case where a diffraction pattern was observed was defined as the crystallized state, and the case where no diffraction pattern was observed was defined as the non-crystallized (amorphous) state.

With respect to the sample S1, the examiner recognized a diffraction pattern on an insulating film side at an interface between the n-type semiconductor layer and the insulating film and recognized crystallization of the insulating film of approximately 4 mm from the interface.

With respect to the sample S2, the examiner failed to recognize a regular atomic array at an interface between the n-type semiconductor layer and the insulating film and recognized non-crystallization in the insulating film. The results of the first evaluation test accordingly show that insertion of the first film 162 containing silicon dioxide between the n-type semiconductor layer and the second film 164 containing aluminum oxide prevents crystallization in the second film 164.

The insulating film deposited by atomic layer deposition generally includes a lot of impurities. It has been reported that aluminum oxide including a lot of impurities (especially hydrogen) starts crystallization at approximately 500° C. With respect to the sample S2, however, heat treatment of the second film 164 at 500° C. does not start crystallization. This is attributed to insertion of the first film 162 between the n-type semiconductor layer and the second film 164.

A-4. Second Evaluation Test

In a second evaluation test, the examiner formed an insulating film on an n-type substrate and formed an electrode mainly made of titanium nitride (TiN) on the insulating film, so as to produce samples S3, S4 and S5. A procedure described below was employed to form the electrode. The electrode was formed on the insulating film by sequentially performing (1) heat treatment at 500° C. in a nitrogen atmosphere after formation of the insulating film on the n-type substrate, (2) deposition of titanium nitride by sputtering, (3) patterning with a photoresist, (4) removal of titanium nitride of a portion that was not covered by the photoresist, and (5) removal of the photoresist. The samples S3, S4 and S5 had MOS structures.

The insulating film of the sample S3 is mainly made of aluminum oxide ($Al_2O_3$). The insulating films of the samples S4 and S5 are identical with the gate insulating film 160 of the first embodiment. In the samples S4 and S5, the first film 162 and the second film 164 are sequentially placed on the n-type substrate. The thickness of the first film 162 is 2 nm in the sample S4. The thickness of the first film 162 is 5 nm in the sample S5.

Figure 10:
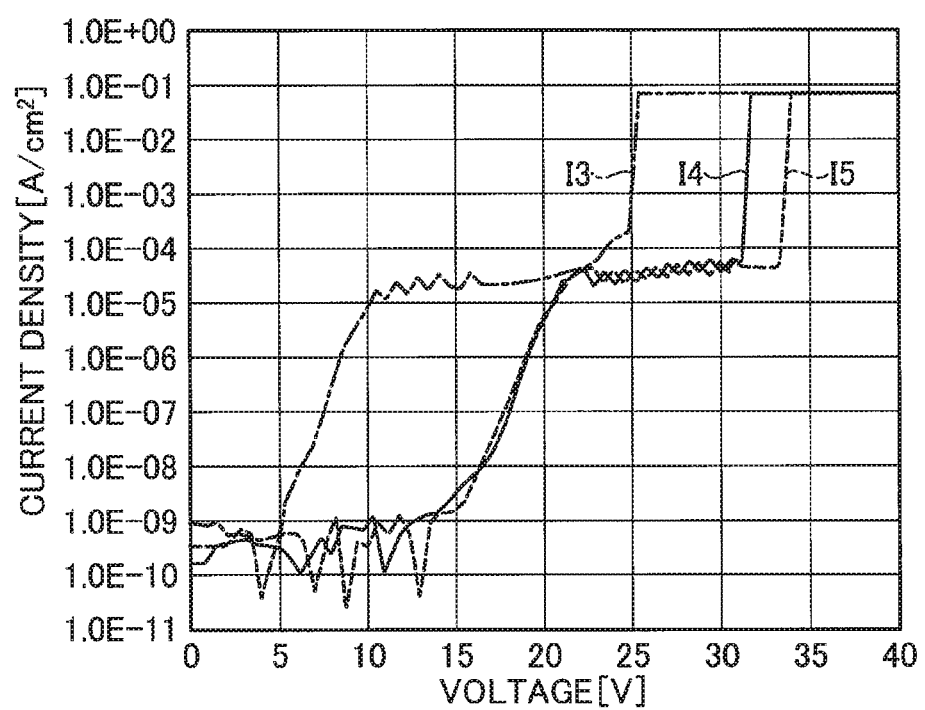
FIG. 10 is a graph showing measurement results of an I-V characteristic.

The examiner measured an I-V characteristic and a C-V characteristic with respect to the samples S3, S4, and S5. FIG. 10 is a graph showing measurement results of the I-V characteristic. The ordinate of FIG. 10 shows the current density, and the abscissa of FIG. 10 shows the voltage. A one-dot chain line curve I3 in FIG. 10 shows the I-V characteristic of the sample S3. A solid line curve I4 in FIG. 10 shows the I-V characteristic of the sample S4. A broken line curve I5 shows the I-V characteristic of the sample S5.

The measurement results of FIG. 10 show that the sample S4 and the sample S5 have less leakage currents compared with the sample S3. Crystallization in the insulating film generates a crystal grain boundary that serves as a pathway of electron propagation and thereby increases the leakage current. These results accordingly mean that crystallization in the insulating film is more suppressed in the sample S4 and in the sample S5, compared with the sample S3. These results show that insertion of the first film 162 containing silicon dioxide between the n-type substrate and the second film 164 containing aluminum oxide prevents crystallization in the second film 164 with respect to the sample S4 and the sample S5.

Figure 11:
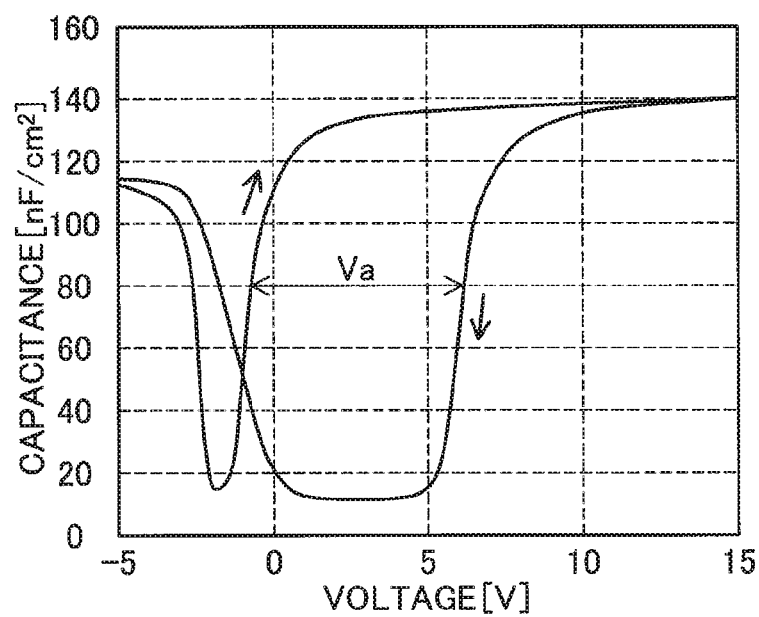
FIG. 11 is a graph showing a measurement result of a C-V characteristic.

FIG. 11 is a graph showing a measurement result of the C-V characteristic with respect to the sample S3. The ordinate of FIG. 11 shows the capacitance, and the abscissa of FIG. 11 shows the voltage. The measurement result of FIG. 11 shows a variation Va of 6.8 V in flat band voltage in sweep of a voltage of 15 V with respect to the sample S3.

Figure 12:
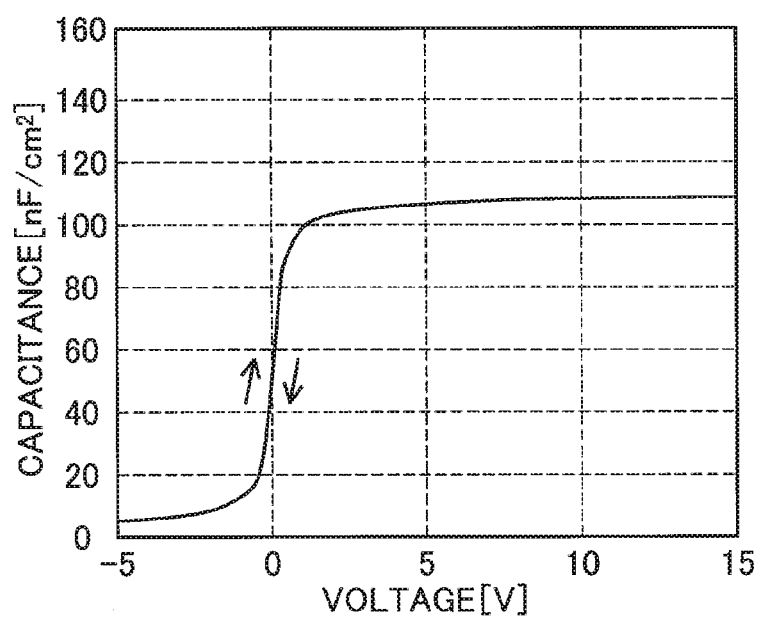
FIG. 12 is a graph showing a measurement result of the C-V characteristic.

FIG. 12 is a graph showing a measurement result of the C-V characteristic with respect to the sample S4. The ordinate and the abscissa of FIG. 12 are identical with the ordinate and the abscissa of FIG. 11. The measurement result of FIG. 12 shows no variation in flat band voltage in sweep of a voltage of 15V with respect to the sample S4.

Crystallization in the insulating film causes a carrier to be trapped by an interface state formed by crystallization and accordingly changes a threshold voltage. These results accordingly mean that crystallization in the insulating film is more suppressed in the sample S4 and in the sample S5, compared with the sample S3. The measurement result of FIG. 11 also indicates prevention of crystallization in the second film 164 with respect to the sample S4 and the sample S5.

A-5. Third Evaluation Test

In a third evaluation test, the examiner measured the I-V characteristic with respect to a sample S4 (called sample S4a) in which the gate insulating film 160 was formed by continuously and successively depositing the second film 164 after deposition of the first film 162 and a sample S4 (called sample S4b) in which the gate insulating film 160 was formed by depositing the second film 164 with some intermission after deposition of the first film 162.

The expression of "with some intermission" herein means that the sample in the course of manufacture is once taken out of the chamber in vacuum that is the production space (and is exposed to the ambient air) in the process of formation of the gate insulating film 160.

Figure 13:
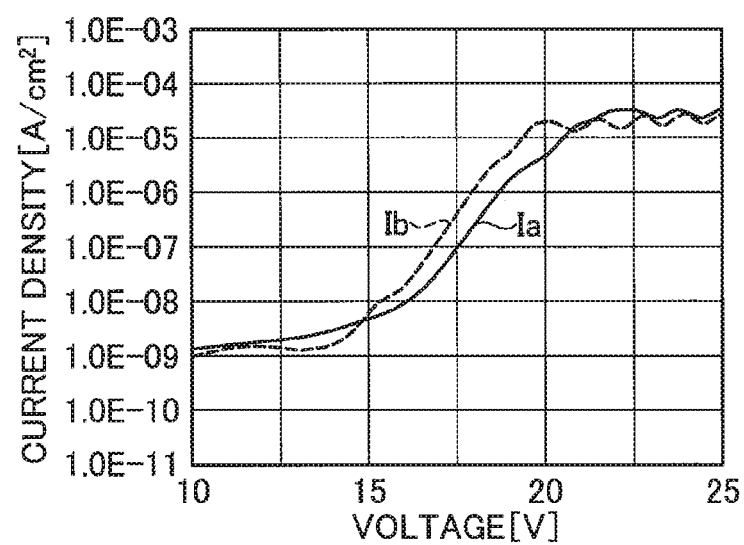
FIG. 13 is a graph showing measurements results of the I-V characteristic.

The examiner measured the I-V characteristic with respect to the sample S4a and the sample S4b. FIG. 13 is a graph showing measurement results of the I-V characteristic. The ordinate and the abscissa of FIG. 13 are identical with the ordinate and the abscissa of FIG. 10. A solid line curve Ia in FIG. 13 shows the I-V characteristic of the sample S4a. A broken line curve Ib in FIG. 13 shows the I-V characteristic of the sample S4b.

The measurement results of FIG. 13 show that the sample S4a has less leakage current compared with the sample S4b. This may be attributed to formation of the gate insulating film 160 by continuously and successively depositing the second film 164 after deposition of the first film 162 and resulting non-pollution of the interface between the first film 162 and the second film 164 with impurities in the air.

The results of the first evaluation test to the third evaluation test described above show that the presence of the first film 162 in the gate insulating film 160 prevents crystallization in the second film 164. The similar advantageous effects have been confirmed with respect to the gate insulating film 160 included in the semiconductor device 100. These accordingly show that the presence of the first film 162 prevents crystallization of aluminum oxide irrespective of whether the first film 162 is placed in a location where the trench 152 is formed.

According to the first embodiment described above, the first film 162 containing silicon dioxide including silicon and having a higher crystallization temperature than that of aluminum oxide is placed between the second film 164 containing aluminum oxide and the n-type semiconductor layer 140 mainly made of gallium nitride and thereby serves to prevent crystallization of aluminum oxide. Additionally, the first film 162 includes hydrogen, nitrogen and carbon as impurities at a predetermined or higher concentration. The first film 162 is thus likely to have a disturbance of the atomic array and is thereby unlikely to be crystallized. This prevents crystallization of aluminum oxide in the second film 164.

The first film 162 including nitrogen at a predetermined or higher concentration may be likely to prevent removal of nitrogen from the n-type semiconductor layer 140 mainly made of gallium nitride (GaN). The first film 162 including hydrogen at a predetermined or higher concentration may be likely to cause hydrogen to be bonded with a dangling bond at the interface between the first film 162 and the n-type semiconductor layer 140, so as to decrease the electron capture level and stabilize the electric properties.

According to the first embodiment, the first film 162 and the second film 164 are formed by atomic layer deposition. This enables the thicknesses of the first film 162 and the second film 164 to be adjusted with high accuracy. This ensures the high covering property for the n-type semiconductor layer 140 having the structure including a level difference, like the trench 152 in the semiconductor device 100 of the first embodiment.

According to the first embodiment, the first film 162 has the thickness of 5 nm and thus more effectively prevents crystallization of aluminum oxide in the second film 164. The results of the second evaluation test show that the first film 162 having the thickness of not less than 2 nm prevents crystallization in the second film 164. The first film 162 formed by atomic layer deposition includes a lot of impurities and is thus likely to increase the leakage current. It is accordingly preferable that the first film 162 has the thinner thickness.

According to the first embodiment, the first film 162 160 is formed to cover the bottom face and the side face of the trench 152, such that the thickness of the first film 162 formed to cover the bottom face of the trench 152 is equal to the thickness of the first film 162 formed to cover the side face of the trench 152. In a configuration that the thickness of the first film formed to cover the bottom face of the trench is different from the thickness of the first film formed to cover the side face of the trench, ununiformity of the thickness of the first film is likely to cause crystallization in a portion of the less thickness in the first film, while keeping a portion of the greater thickness in the first film amorphous. In this case, a strain is likely to occur in the entire gate insulating film. Such a strain leads to an unstable operation of the semiconductor device. The configuration of the first embodiment, on the other hand, prevents such an unstable operation of the semiconductor device.

According to the first embodiment, the first film 162 is formed by atomic layer deposition using ozone as the oxidizing agent. Using ozone having the low reactivity as the oxidizing agent in atomic layer deposition suppresses the n-type semiconductor layer 140 from being damaged.

According to the first embodiment, the gate insulating film 160 is formed by continuously and successively depositing the second film 164 after deposition of the first film 162. This configuration suppresses the interface between the first film 162 and the second film 164 from being polluted with the impurities in the air and thereby reduces the leakage current, compared with the configuration that the second film is formed on the first film with some intermission.

B. Other Embodiments

According to the first embodiment, the gate insulating film 160 and the gate electrode 172 are arranged to adjoin to and to be in contact with each other. The present disclosure is, however, not limited to this configuration. For example, according to another embodiment, the semiconductor device may be configured to have silicon dioxide that is inserted between the gate insulating film 160 and the gate electrode 172 by using oxygen plasma as an oxidizing agent. This configuration furthermore reduces the leakage current, compared with the configuration without insertion of silicon dioxide.

According to the first embodiment, the n-type semiconductor layer 140 is mainly made of gallium nitride (GaN). The present disclosure is, however, not limited to this configuration. For example, according to another embodiment, the n-type semiconductor layer 140 may be mainly made of any of aluminum nitride (AlN), indium nitride (InN), aluminum gallium nitride (AlGaN), gallium indium nitride (GaInN), aluminum indium nitride (AlInN) and aluminum gallium indium nitride (AlGaInN).

According to the first embodiment, the thickness of the first film 162 is 5 nm. The present disclosure is, however, not limited to this configuration. For example, according to another embodiment, the thickness of the first film 162 may be thinner than 5 nm.

According to the first embodiment, the first film 162 and the second film 164 are formed by atomic layer deposition. The present disclosure is, however, not limited to this configuration. For example, according to another embodiment, at least one of the first film 162 and the second film 164 may be formed by CVD or by sputtering.

According to the first embodiment, the first film 162 is formed by atomic layer deposition using ozone as the oxidizing agent. The present disclosure is, however, not limited to this configuration. For example, according to another embodiment, the first film 162 may be formed by atomic layer deposition using water as the oxidizing agent.

According to the first embodiment, the gate insulating film 160 is formed by continuously and successively depositing the second film 164 after deposition of the first film 162. The present disclosure is, however, not limited to this configuration. For example, according to another embodiment, the gate insulating film 160 may be formed by depositing the second film 164 with some intermission after deposition of the first film 162.

The disclosure is not limited to any of the embodiment and its modifications described above but may be implemented by a diversity of configurations without departing from the scope of the disclosure. For example, the technical features of any of the above embodiments and their modifications may be replaced or combined appropriately, in order to solve part or all of the problems described above or in order to achieve part or all of the advantageous effects described above. Any of the technical features may be omitted appropriately unless the technical feature is described as essential in the description hereof. The present disclosure may be implemented by aspects described below.

According to one aspect of the present disclosure, there is provided a semiconductor device. This semiconductor device comprises a group III nitride semiconductor layer; a gate insulating film formed on the group III nitride semiconductor layer; and a gate electrode formed on the gate insulating film. The gate insulating film comprises a first film that is placed on the group III nitride semiconductor layer, includes silicon; and a second film that is placed on the first film and contains aluminum oxide. The first film has a higher crystallization temperature than a crystallization temperature of aluminum oxide and has a hydrogen concentration of not lower than $1\times10^{21}$ atoms/cm$^3$, a nitrogen concentration of not lower than $1\times10^{19}$ atoms/cm$^3$ and a carbon concentration of not lower than $1\times10^{19}$ atoms/cm$^3$. According to this aspect, the first film including silicon and having the higher crystallization temperature than the crystallization temperature of aluminum oxide is placed between the second film containing aluminum oxide and the group III nitride semiconductor layer. This prevents crystallization of aluminum oxide. Additionally, the first film includes hydrogen, nitrogen and carbon as impurities at a predetermined or higher concentration. The first film is thus likely to have a disturbance of an atomic array and is thereby unlikely to be crystallized. This configuration prevents crystallization of aluminum oxide in the second film.

In the semiconductor device of the above aspect, the first film may have a thickness of at least not less than 2 nm. According to this aspect, the thickness of the first film is not less than 2 nm. This configuration more effectively prevents crystallization of aluminum oxide in the second film.

In the semiconductor device of the above aspect, the group III nitride semiconductor layer may have a trench, and the gate insulating film may be formed to cover a bottom face and a side face of the trench, such that a thickness of the gate insulating film formed to cover the bottom face is equal to a thickness of the gate insulating film formed to cover the side face. In a configuration that the thickness of the gate insulating film formed to cover the bottom face of the trench is different from the thickness of the gate insulating film formed to cover the side face of the trench, ununiformity of the thickness of the gate insulating film is likely to cause crystallization in a portion of the less thickness in the gate insulating film, while keeping a portion of the greater thickness in the gate insulating film amorphous. In this case, a strain is likely to occur in the entire gate insulating film. Such a strain leads to an unstable operation of the semiconductor device. According to this aspect, however, the gate insulating film is formed such that the thickness of the gate insulating film formed to cover the bottom face of the trench is equal to the thickness of the gate insulating film formed to cover the side face of the trench. This configuration prevents an unstable operation of the semiconductor device.

According to one aspect of the present disclosure, there is provided a manufacturing method of the semiconductor device. This manufacturing method comprises forming the first film by atomic layer deposition. This configuration enables the thicknesses of the first film to be adjusted with high accuracy. This configuration also ensures the high covering property for the group III nitride semiconductor layer having the structure including a level difference.

The manufacturing method of the semiconductor device according to the above aspect may comprise forming the first film by atomic layer deposition using ozone as an oxidizing agent. This configuration uses ozone having the low reactivity as the oxidizing agent in atomic layer deposition and thereby suppresses the group III nitride semiconductor layer from being damaged.

The manufacturing method of the semiconductor device according to the above aspect may comprise continuously and successively forming the second film on the first film. This configuration prevents the interface between the first film and the second film from being polluted with the impurities in the air. This configuration accordingly reduces the leakage current, compared with a configuration that the second film is formed on the first film with some intermission.

The disclosure may be implemented by any of various aspects other than the semiconductor device and the manufacturing method of the semiconductor device described above, for example, a schottky barrier diode, a semiconductor, an electric device with any of the schottky barrier diode, the semiconductor and the semiconductor device of any of the above aspects incorporated therein, a manufacturing apparatus for manufacturing the semiconductor device, a design method of any of such device and apparatus, and a manufacturing method of any of such device and apparatus.

According to any of the above aspects of the present disclosure, the first film including silicon and having the higher crystallization temperature than the crystallization temperature of aluminum oxide is placed between the second film containing aluminum oxide and the group III nitride semiconductor layer. This configuration prevents crystallization of aluminum oxide. Additionally, the first film includes hydrogen, nitrogen and carbon as impurities as a predetermined or higher concentration. The first film is thus likely to have a disturbance of an atomic array and is thereby unlikely to be crystallized. This prevents crystallization of aluminum oxide in the second film.

What is claimed is:
1. A semiconductor device, comprising:
a group III nitride semiconductor layer;
a gate insulating film formed on the group III nitride semiconductor layer; and
a gate electrode formed on the gate insulating film, wherein
the gate insulating film comprises:
a first film that is placed on the group III nitride semiconductor layer, includes silicon and has a higher crystallization temperature than a crystallization temperature of aluminum oxide; and
a second film that is placed on the first film and contains aluminum oxide, wherein
the first film has a hydrogen concentration of not lower than $1\times10^{21}$ atoms/cm$^3$, a nitrogen concentration of not lower than $1\times10^{19}$ atoms/cm$^3$ and a carbon concentration of not lower than $1\times10^{19}$ atoms/cm$^3$.
2. The semiconductor device according to claim 1, wherein the first film has a thickness of at least not less than 2 nm.
3. The semiconductor device according to claim 1, wherein the group III nitride semiconductor layer has a trench, and
the gate insulating film is formed to cover a bottom face and a side face of the trench, such that a thickness of the gate insulating film formed to cover the bottom face is equal to a thickness of the gate insulating film formed to cover the side face.
4. A manufacturing method of the semiconductor device according to claim 1, the manufacturing method comprising:
forming the first film by atomic layer deposition.

5. The manufacturing method of the semiconductor device according to claim 4, the manufacturing method comprising:
   forming the first film by atomic layer deposition using ozone as an oxidizing agent.

6. The manufacturing method of the semiconductor device according to claim 4, the manufacturing method comprising:
   continuously and successively forming the second film on the first film.

* * * * *